(12) United States Patent
Wei et al.

(10) Patent No.: US 11,101,806 B2
(45) Date of Patent: Aug. 24, 2021

(54) FREQUENCY REGULATOR AND FREQUENCY REGULATING METHOD THEREOF, AND ELECTRONIC DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xiangye Wei, Beijing (CN); Liming Xiu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,638

(22) PCT Filed: Jan. 2, 2019

(86) PCT No.: PCT/CN2019/070132
§ 371 (c)(1),
(2) Date: Feb. 7, 2020

(87) PCT Pub. No.: WO2020/140207
PCT Pub. Date: Jul. 9, 2020

(65) Prior Publication Data
US 2021/0075426 A1    Mar. 11, 2021

(51) Int. Cl.
*H03K 7/06* (2006.01)
*H03L 7/085* (2006.01)
*H03L 7/099* (2006.01)

(52) U.S. Cl.
CPC ............. *H03L 7/085* (2013.01); *H03K 7/06* (2013.01); *H03L 7/099* (2013.01)

(58) Field of Classification Search
CPC ....... H03L 7/085; H03L 7/099; H03L 7/0992; H03L 7/183; H03L 7/191; H03L 7/197;
(Continued)

(56) References Cited

U.S. PATENT DOCUMENTS 6,728,526 B2 *  4/2004  Yamada ................ H03L 7/1976
                                                       331/1 A
9,379,719 B1    6/2016  Huang
(Continued)

FOREIGN PATENT DOCUMENTS

CN    102447475 A    5/2012
CN    103095297 A    5/2013
(Continued)

*Primary Examiner* — Jung Kim
(74) *Attorney, Agent, or Firm* — Dilworth & Barrese, LLP.; Michael J. Musella, Esq.

(57) ABSTRACT

A frequency regulator and a frequency regulating method thereof, and an electronic device are disclosed. The frequency regulator includes: a signal processing circuit configured to generate a frequency control word according to a frequency regulating coefficient and an input frequency; and a frequency regulating circuit configured to receive the frequency control word and to generate and output an output signal having a target frequency according to the frequency control word. The frequency regulating coefficient is an arbitrary positive real number and is expressed as M.m, M is an integer portion of the frequency regulating coefficient and is a natural number, and m is a decimal portion of the frequency regulating coefficient.

20 Claims, 8 Drawing Sheets

(58) Field of Classification Search
CPC ..... H03L 2207/06; H03L 7/18; H03L 7/1976; H03K 7/06
See application file for complete search history.

(56) References Cited

U.S. PATENT DOCUMENTS

| | | |
|---|---|---|
| 2017/0126237 A1 | 5/2017 | Pavao Moreira et al. |
| 2018/0196460 A1 | 7/2018 | Xiu |
| 2019/0052276 A1 | 2/2019 | Xiu |
| 2019/0123749 A1 | 4/2019 | Xiu |
| 2019/0238143 A1 | 8/2019 | Xiu |

FOREIGN PATENT DOCUMENTS

| | | | | |
|---|---|---|---|---|
| CN | 106708166 A1 | | 5/2017 | |
| CN | 107425851 A | * | 12/2017 | ............. H03L 7/099 |
| CN | 107425851 A | | 12/2017 | |
| CN | 108270437 A | | 7/2018 | |
| CN | 108429551 A | | 8/2018 | |

* cited by examiner

FREQUENCY REGULATOR AND FREQUENCY REGULATING METHOD THEREOF, AND ELECTRONIC DEVICE

TECHNICAL FIELD

Embodiments of the present disclosure relate to a frequency regulator and a frequency regulating method thereof, and an electronic device.

BACKGROUND

In the integrated circuit chip, the clock signal represents the time stream, and the clock signal can ensure the normal operation of the entire electronic system. All events and tasks in the electronic system are performed based on the rhythm of the clock signal. Therefore, a circuit capable of generating a clock signal having an arbitrary frequency is essential for the electronic system.

Currently, within an integrated circuit chip, a phase-locked loop (PLL) can implement most of the frequency synthesis tasks. However, the phase-locked loop has some obvious shortcomings. For example, the high-performance phase-locked loop requires a large number of analog circuits, and the analog circuits may increase the cost of such as the area and power consumption of the integrated circuit chip. Simultaneously, the frequency of the signal output by the phase-locked loop is not arbitrary.

SUMMARY

At least an embodiment of the present disclosure provides a frequency regulator, and the frequency regulator includes: a signal processing circuit, configured to generate a frequency control word according to a frequency regulating coefficient and an input frequency; and a frequency regulating circuit, configured to receive the frequency control word and to generate and output an output signal having a target frequency according to the frequency control word. The frequency regulating coefficient is an arbitrary positive real number and is expressed as M.m, M is an integer portion of the frequency regulating coefficient and is a natural number, and m is a decimal portion of the frequency regulating coefficient.

For example, in the frequency regulator provided by an embodiment of the present disclosure, the signal processing circuit includes: an input sub-circuit, configured to obtain an input signal having the input frequency and the frequency regulating coefficient; a frequency detecting sub-circuit, configured to count the input signal within a preset period to obtain a count value of the input signal, and to determine the input frequency based on the count value; and a processing sub-circuit, configured to generate the frequency control word according to the input frequency and the frequency regulating coefficient.

For example, in the frequency regulator provided by an embodiment of the present disclosure, a relationship between the frequency control word and the frequency regulating coefficient is expressed as: $F=f_A/((M.m)\cdot f_i)$, F represents the frequency control word, $f_i$ represents the input frequency, and $f_A$ represents a value of a frequency of a base time unit.

For example, in the frequency regulator provided by an embodiment of the present disclosure, the processing sub-circuit is further configured to perform an integer processing on the frequency regulating coefficient to obtain an integer frequency regulating coefficient, and to generate the frequency control word according to the input frequency and the integer frequency regulating coefficient.

For example, in the frequency regulator provided by an embodiment of the present disclosure, a relationship between the frequency control word and the integer frequency regulating coefficient is expressed as: $F=(f_A\cdot 2^m)/(N\cdot f_i)$, F represents the frequency control word, $N=(M.m)\cdot 2^m$, N represents the integer frequency regulating coefficient and is a positive integer greater than 1, $f_i$ represents the input frequency, $f_A$ represents a value of a frequency of a base time unit, and Q is a positive integer.

For example, in the frequency regulator provided by an embodiment of the present disclosure, a relationship between the frequency control word and the integer frequency regulating coefficient is expressed as: $F=(f_A\cdot 2^m\cdot Q)/(N\cdot f_i)$, F represents the frequency control word, $N=(M.m)\cdot 2^m$, N represents the integer frequency regulating coefficient and is a positive integer greater than 1, $f_i$ represents the input frequency, $f_A$ represents a value of a frequency of a base time unit, and Q is a positive integer.

For example, in the frequency regulator provided by an embodiment of the present disclosure, the input frequency is expressed as: $f_i=f_{cnt}/T$, $f_i$ represents the input frequency, font represents the count value, T represents the preset period, and a unit of the preset period is a second.

For example, in the frequency regulator provided by an embodiment of the present disclosure, the frequency detecting sub-circuit includes a counting module, a period generation module, and a calculation module, the period generation module is configured to generate the preset period under control of a clock signal; the counting module is configured to count the input signal within the preset period to obtain the count value of the input signal; and the calculation module is configured to determine the input frequency based on the count value, and to output the input frequency to the processing sub-circuit.

For example, in the frequency regulator provided by an embodiment of the present disclosure, the processing sub-circuit includes a shift register module, a multiplication module, and a division module, the shift register module is configured to receive and process the frequency of the base time unit; the multiplication module is configured to receive the input frequency and the frequency regulating coefficient, and to perform multiplication processing on the input frequency and the frequency regulating coefficient; and the division module is configured to receive an output of the shift register module and an output of the multiplication module, and to divide the output of the shift register module by the output of the multiplication module to obtain the frequency control word.

For example, in the frequency regulator provided by an embodiment of the present disclosure, the frequency regulating circuit includes: a base time unit generation sub-circuit, configured to generate and output a base time unit; and a frequency regulating sub-circuit, configured to generate and output the output signal having the target frequency according to the frequency control word and the base time unit.

For example, in the frequency regulator provided by an embodiment of the present disclosure, the base time unit generation sub-circuit includes: a voltage-controlled oscillator, configured to oscillate at a predetermined oscillation frequency; a phase-locked loop circuit, configured to lock an output frequency of the voltage-controlled oscillator at a base output frequency; and K output terminals, configured to output K output signals with phases evenly spaced, where K is a positive integer greater than 1. The base output frequency is expressed as $f_d$, the base time unit is a time span between any two adjacent output signals output by the K output terminals, the base time unit is expressed as $\Delta$, and $\Delta=1/(K \cdot f_d)$.

For example, in the frequency regulator provided by an embodiment of the present disclosure, the frequency regulating sub-circuit is a time-average-frequency direct period synthesizer.

At least an embodiment of the present disclosure further provides an electronic device, including: a frequency source configured to provide an input signal having an input frequency, and the frequency regulator according to any one of the above embodiments.

At least an embodiment of the present disclosure further provides a frequency regulating method applicable to the frequency regulator according to any one of the above embodiments, and the frequency regulating method includes: generating the frequency control word according to the input frequency and the frequency regulating coefficient; and generating and outputting an output signal having the target frequency according to the frequency control word.

For example, in the frequency regulating method provided by an embodiment of the present disclosure, generating the frequency control word according to the input frequency and the frequency regulating coefficient includes: obtaining an input signal having the input frequency and the frequency regulating coefficient; counting the input signal based on a preset period to obtain a count value of the input signal; determining the input frequency based on the count value; and generating the frequency control word according to the input frequency and the frequency regulating coefficient.

For example, in the frequency regulating method provided by an embodiment of the present disclosure, generating the frequency control word according to the input frequency and the frequency regulating coefficient includes: obtaining an input signal having the input frequency and the frequency regulating coefficient; counting the input signal based on a preset period to obtain a count value of the input signal; determining the input frequency based on the count value; performing integer processing on the frequency regulating coefficient to obtain an integer frequency regulating coefficient; and generating the frequency control word according to the input frequency and the integer frequency regulating coefficient.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
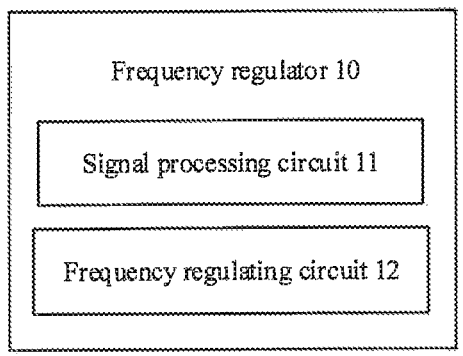
FIG. 1 is a schematic block diagram of a frequency regulator provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the present disclosure omits detailed descriptions of known functions and known components.

Currently, a frequency regulating coefficient of an integer-type phase-locked loop is an integer, and a frequency regulating coefficient of a decimal-type phase-locked loop is extremely limited. In order to obtain signals of different frequencies, a plurality of frequency synthesizing circuits need to be provided in one integrated circuit chip, so as to provide signals of different frequencies to different electronic devices. However, the plurality of frequency synthesizing circuits may occupy a large area of the integrated circuit chip, thereby increasing the volume of the integrated circuit chip and further increasing the production cost, which is not conducive to the miniaturization and lightness of the integrated circuit chip, and further cannot adapt to the functional diversification and functional complexity of the circuit in the Internet of Things era.

At least an embodiment of the present disclosure provides a frequency regulator and a frequency regulating method thereof, and an electronic device. The frequency regulator can still provide a high-precision and high-stability output signal on the premise that an arbitrary frequency regulating coefficient can be implemented. The process of obtaining the output signal is simple, highly efficient, and easy to control. In addition, the frequency regulator is a pure digital circuit and has the characteristics such as small size, low power consumption, easy integration, etc., and the frequency regulator can improve the working efficiency of the electronic system.

In the following, the embodiments of the present disclosure are described in detail with reference to the accompanying drawings, but the present disclosure is not limited to these specific embodiments.

Figure 2A:
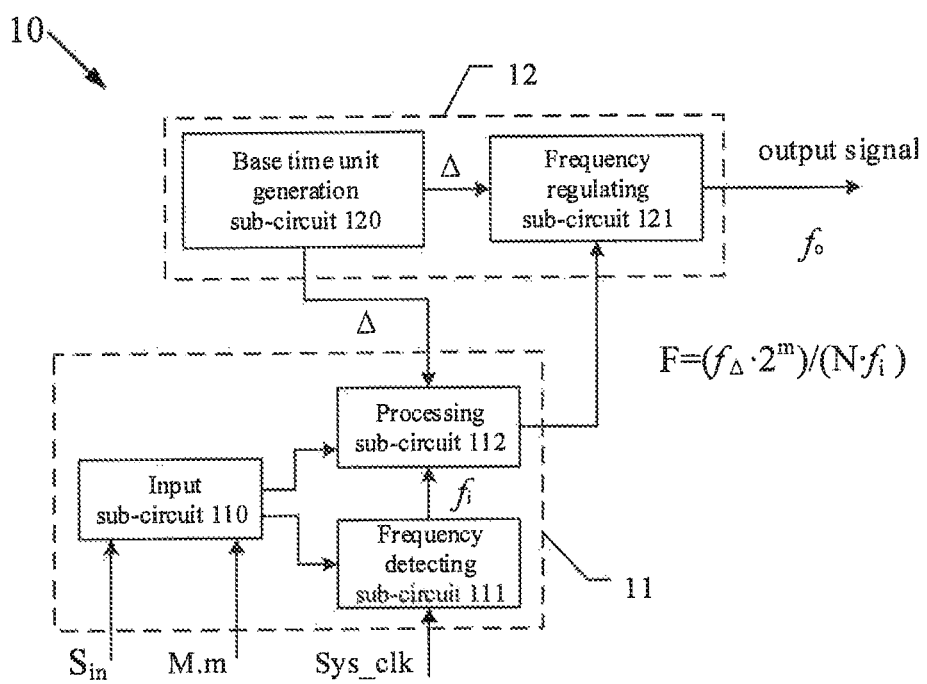
FIG. 2A is a structural schematic diagram of a frequency regulator provided by an embodiment of the present disclosure.
Figure 2B:
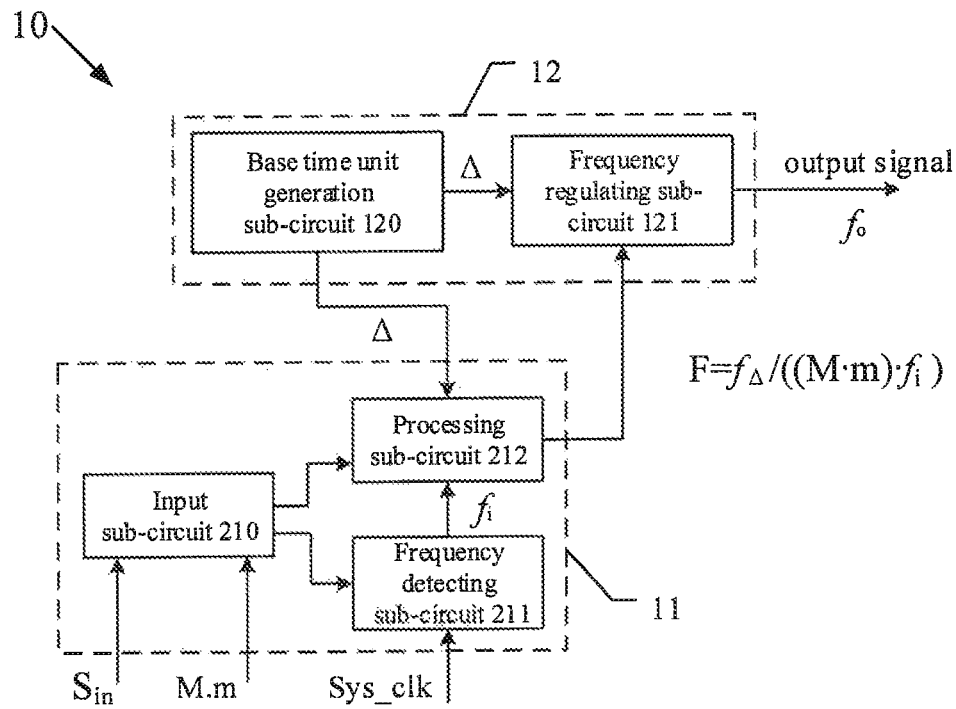
FIG. 2B is a structural schematic diagram of another frequency regulator provided by an embodiment of the present disclosure.

FIG. 1 is a schematic block diagram of a frequency regulator provided by an embodiment of the present disclosure, FIG. 2A is a structural schematic diagram of a frequency regulator provided by an embodiment of the present disclosure, and FIG. 2B is a structural schematic diagram of another frequency regulator provided by an embodiment of the present disclosure.

For example, as illustrated in FIG. 1, the frequency regulator 10 may include a signal processing circuit 11 and a frequency regulating circuit 12. The signal processing circuit 11 is configured to generate a frequency control word according to a frequency regulating coefficient and an input frequency. The frequency regulating circuit 12 is configured to receive the frequency control word and to generate and output an output signal having a target frequency according to the frequency control word.

For example, the frequency regulating coefficient can be an arbitrary positive real number and is expressed as M.m, M is an integer portion of the frequency regulating coefficient and is a natural number, and m is a decimal portion of the frequency regulating coefficient and may also be a natural number, such as a non-zero positive integer. For example, in some embodiments, the frequency regulating coefficient may be 0.25 (correspondingly, M is 0 and m is 25), 4.78 (correspondingly, M is 4 and m is 78), 5.0 (correspondingly, M is 5 and m is 0), etc. The frequency regulating coefficient can be specifically determined according to the user requirements, and the present disclosure is not limited in this aspect.

It should be noted that the precision of the frequency regulating coefficient depends on the output precision of the time-average-frequency direct period synthesizer (TAF-DPS) which will be described below. The output precision of the TAF-DPS is related to the circuit structure layout. In the embodiments of the present disclosure, the decimal portion of the frequency regulating coefficient includes approximately 10 to 12 decimal places.

For example, in a case where the frequency regulating coefficient is greater than 1, the frequency regulator 10 can implement frequency multiplication; and in a case where the frequency regulating coefficient is less than 1, the frequency regulator10 can implement frequency division. For example, in a case where the input frequency is 20 MHz, if the target frequency desired by the user is 100 MHz, the frequency regulating coefficient M.m=5.0 needs to be input. In this case, the target frequency of the output signal output by the frequency regulator 10 is 100 MHz. If the target frequency desired by the user is 5 MHz, the frequency regulating coefficient M.m=0.25 needs to be input. In this case, the target frequency of the output signal output by the frequency regulator 10 is 5 MHz.

For example, the input frequency can be any value. The input signal having the input frequency may be generated by a frequency source (for example, the frequency source may include a self-excited oscillation source and a synthetic frequency source). For example, the input frequency may represent the frequency of the signal actually generated and output by the frequency source. The target frequency represents the frequency of the signal desired by the user. For example, the target frequency represents the frequency that the signal output by the frequency regulator 10 can reach. For example, the ratio between the target frequency and the input frequency is the frequency regulating coefficient, that is, the ratio between the target frequency and the input frequency can be any value.

For example, both the input signal and the output signal can be pulse signals.

For example, the frequency control word is used to control the frequency (that is, the target frequency) of the output signal, and the frequency control word can be changed according to the frequency regulating coefficient and the input frequency. For example, with respect to the same input frequency, if the frequency regulating coefficient changes, the frequency control word changes accordingly. Similarly, with respect to the same frequency regulating coefficient, if the input frequency changes, the frequency control word changes accordingly.

For example, the target frequency may change with the frequency control word. With respect to the same input frequency, in a case where the frequency regulating coefficient changes, the frequency control word changes, and the final target frequency also changes accordingly, so that the input signal having the same input frequency can be converted into the output signals having different target frequencies, so as to satisfy the requirements of different electronic devices.

For example, the signal processing circuit 11 may be implemented by hardware, the signal processing circuit 11 may also be implemented by software, or the signal processing circuit 11 may also be implemented by a combination of hardware and software. In some embodiments, the signal processing circuit 11 may be implemented by hardware or by the combination of hardware and software. As illustrated in FIG. 2A, the signal processing circuit 11 may include an input sub-circuit 110, a frequency detecting sub-circuit 111, and a processing sub-circuit 112. The input sub-circuit 110 is configured to obtain an input signal $S_{in}$ having the input frequency $f_i$ and the frequency regulating coefficient M.m. The frequency detecting sub-circuit 111 is configured to count the input signal $S_{in}$ within a preset period to obtain a count value of the input signal $S_{in}$ and to determine the input frequency $f_i$ based on the count value. The processing sub-circuit 112 is configured to perform integer processing on the frequency regulating coefficient M.m to obtain an integer frequency regulating coefficient and generate the frequency control word F according to the input frequency f; and the integer frequency regulating coefficient.

For example, the input sub-circuit 110 may be electrically connected to the frequency source to obtain the input signal having the input frequency. The frequency regulating coefficient M.m can be input to the input sub-circuit 110 through a data interface by the user through an input device (for example, a keyboard, a touch screen, a touch pad, a mouse, a knob, etc.).

For example, the frequency detecting sub-circuit 111 may determine the input frequency by using the counting principle. For example, the frequency detecting sub-circuit 111 may use a clock signal to count the input signal within the preset period to obtain the count value, and then determine the input frequency according to the count value. For example, the input frequency is expressed as:

$$f_i = f_{cnt}/T \qquad (1),$$

where $f_i$ represents the input frequency, $f_{cnt}$ represents the count value, T represents the preset period, and the unit of the preset period is the second. The preset period T can be set according to practical application requirements. For example, the preset period T can be 1 second, thereby improving the accuracy of counting the input signal. Where the preset period T is 1 second, it can be seen that the count value $f_{cnt}$ is the value of the input frequency $f_i$ according to the above formula (1). The present disclosure is not limited in this aspect, and the preset period T may also be 0.01 seconds, 0.1 seconds, 0.5 seconds, 2 seconds, etc. The clock signal can be generated by a clock generator, and the clock signal can be used not only for counting, but also for other functions in the entire system, such as synchronization.

Figure 3:
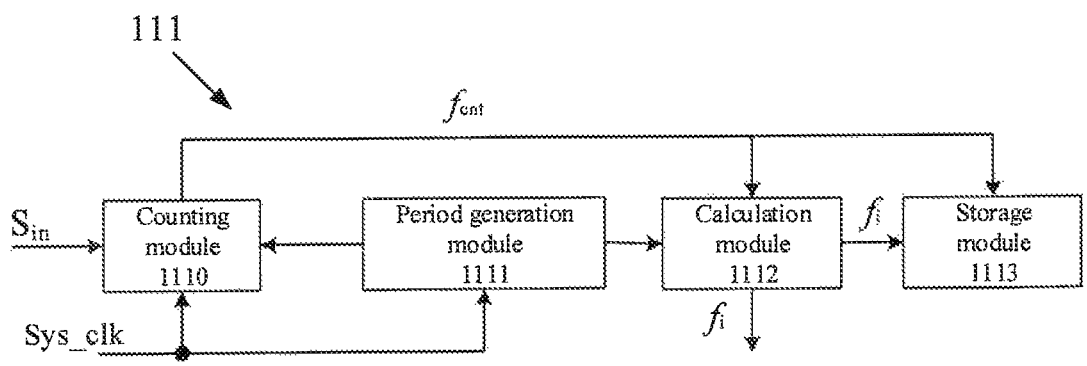
FIG. 3 is a structural schematic diagram of a frequency detecting sub-circuit provided by an embodiment of the present disclosure.

FIG. 3 is a structural schematic diagram of a frequency detecting sub-circuit provided by an embodiment of the present disclosure. As illustrated in FIG. 3, in some examples, the frequency detecting sub-circuit 111 includes a counting module 1110 (or a counting sub-circuit), a period generation module 1111 (or a period generation sub-circuit), a calculation module 1112 (or a calculation sub-circuit), and a storage module 1113 (or a storage sub-circuit). The period generation module 1111 is configured to generate the preset period under control of the clock signal. The counting module 1110 is configured to count the input signal $S_{in}$ within the preset period to obtain the count value of the input signal $S_{in}$. The storage module 1113 is configured to store the count value. The calculation module 1112 is configured to determine the input frequency based on the count value and to output the input frequency to the processing sub-circuit 112. The calculation module 1112 can calculate the input frequency according to the above formula (1). For example, the calculation module 1112 is further configured to output the input frequency to the storage module 1113, and the storage module 1113 can further store the value of the input frequency.

It should be noted that the input signal is a pulse signal, and the count value may represent the number of pulses of the input signal within the preset period.

For example, as illustrated in FIG. 3, Sys_clk represents the clock signal, and the clock signal Sys_clk may be the clock signal of the system. The counting module 1110 can count the input signal within the preset period, the period generation module 1111 can implement a counting window for generating the preset period T (for example, 1 second) through the clock signal Sys_clk, and the count value of the input signal is stored in the storage module 1113 at intervals of the preset period T.

For example, the storage module 1113 may be various types of storage media or registers, and the like. The counting module 1110, the period generation module 1111, and the calculation module 1112 may be implemented by using the hardware circuit. The calculation module 1112 and the counting module 1110 can be composed of components such as transistors, resistors, flip-flops, capacitors, and operational amplifiers. For example, the calculation module 1112 may include a division circuit, a multiplication circuit, etc., and the counting module 1110 may include an addition counter, etc. The period generation module 1111 may be composed of components such as flip-flops, etc. Certainly, the functions of the counting module 1110, the period generation module 1111, and the calculation module 1112 can also be implemented by software. For example, the storage module 1113 may further store computer instructions and data, and the processor may execute the computer instructions and data stored in the storage module 1113 to implement the functions of the counting module 1110, the period generation module 1111, and the calculation module 1112.

For example, the processing sub-circuit 112 is configured to receive the value of the input frequency output by the frequency detecting sub-circuit 111, the frequency regulating coefficient transmitted by the input sub-circuit 110, the base time unit generated by a base time unit generation sub-circuit (to be described below), and to calculate the frequency control word based on the value of the input frequency, the frequency regulating coefficient, and the value of the frequency of the base time unit. For example, in the embodiment illustrated in FIG. 2A, the processing sub-circuit 112 is implemented by hardware. Because the hardware cannot directly handle floating point decimals (for example, the frequency regulating coefficient M.m), the processing sub-circuit 112 needs to perform integer processing on the frequency regulating coefficient M.m to obtain the integer frequency regulating coefficient, and then generates the frequency control word according to the input frequency and the integer frequency regulating coefficient.

For example, as illustrated in FIG. 2A, the relationship between the frequency control word and the integer frequency regulating coefficient is expressed as:

$$F = (f_\Delta \cdot 2^m)/(N \cdot f_i) \qquad (2),$$

where F represents the frequency control word, N represents the integer frequency regulating coefficient and is a positive integer greater than 1, $f_i$ represents the input frequency, and $f_\Delta$ represents the value of the frequency of the base time unit. For example, the frequency regulating coefficient M.m can be a binary number, and $N=(M.m) \cdot 2^m$. Therefore, in the above formula (2), all multiplication factors are integers and can be mapped by hardware, thereby rapidly calculating the frequency control word F.

Figure 4:
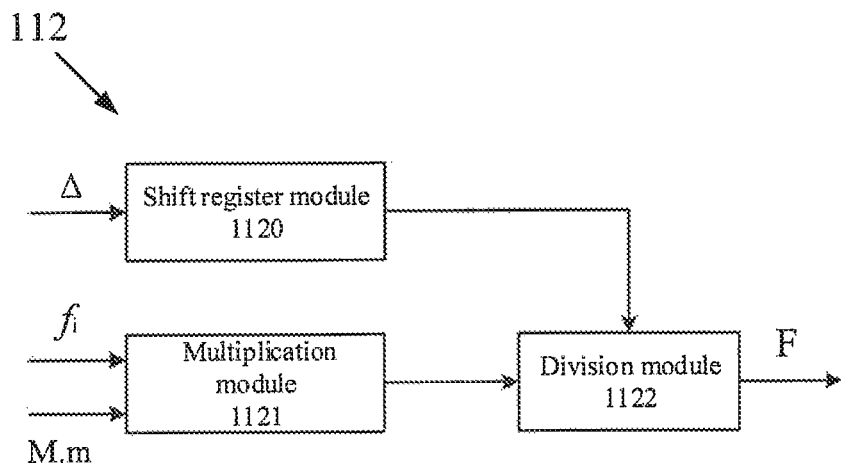
FIG. 4 is a structural schematic diagram of a processing sub-circuit provided by an embodiment of the present disclosure.

FIG. 4 is a structural schematic diagram of a processing sub-circuit provided by an embodiment of the present disclosure. As illustrated in FIG. 4, in some examples, the processing sub-circuit 112 includes a shift register module 1120, a multiplication module 1121, and a division module 1122. The shift register module 1120 is configured to receive and process the frequency of the base time unit. The multiplication module 1121 is configured to receive the input frequency and the frequency regulating coefficient, and to perform multiplication processing on the input frequency and the frequency regulating coefficient. The division module 1122 is configured to receive an output of the shift register module 1120 and an output of the multiplication module 1121, and to divide the output of the shift register module 1120 by the output of the multiplication module 1121 to obtain the frequency control word.

It should be noted that, in the embodiment illustrated in FIG. 2A, the shift register module 1120, the multiplication module 1121, and the division module 1122 are all implemented by hardware circuits. For example, the shift register module 1120 may include the shift register, the multiplication module 1121 may include the multiplier, and the division module 1122 may include the divider.

For example, in some embodiments, the relationship between the frequency control word and the integer frequency regulating coefficient is expressed as:

$$F=(f_\Delta \cdot 2^m \cdot Q)/(N \cdot f_i) \quad (3),$$

where F represents the frequency control word, N represents the integer frequency regulating coefficient and is a positive integer greater than 1, $f_i$ represents the input frequency, $f_\Delta$ represents the value of the frequency of the base time unit, and Q is a positive integer. For example, the frequency regulating coefficient M.m can be a binary number, and $N=(M.m) \cdot 2^m$. Therefore, in the above formula (3), all multiplication factors are integers and can be mapped by hardware, thereby rapidly calculating the frequency control word F.

For example, the shift register module 1120 can adjust the precision of the value $f_\Delta$ of the frequency of the base time unit, thereby controlling the precision of the frequency control word. For example, the output of the shift register module 1120 can be expressed as $f_s$, and $f_s$ can be expressed as: $f_s=f_\Delta \cdot Q$. It should be noted that Q is used to represent the number of bits where the precision of the value $f_\Delta$ of the frequency of the base time unit is increased, that is, represents the number of bits where the precision of the frequency control word F is increased. The absolute value of $f_s$ can be the same as the absolute value of $f_\Delta$, but the precision of $f_s$ and the precision of the $f_\Delta$ are different. The shift register module 1120 may increase the precision of the value $f_\Delta$ of the frequency of the base time unit by Q bits (for example, shift Q bits to the left) to obtain $f_s$, and Q represents the number of bit lines increased in the hardware circuit. For example, if Q is 5, the precision of the value $f_\Delta$ of the frequency of the base time unit is 20 bits, and the precision of $f_s$ is 25 (20+5) bits. The precision of the frequency control word F is related to Q, the frequency regulating coefficient M.m, etc. In a case where the frequency regulating coefficient M.m is constant, if Q is larger, the precision of $f_s$ is higher, so that the precision of the frequency control word F can be higher. In the case of binary, for example, in the formula (3), if the precision of the numerator is 50 bits and the precision of the denominator is 20 bits, then the precision of the frequency control word F is 30 bits, where the integer portion of the frequency control word F is 5 bits, and the decimal portion of the frequency control word F is 25 bits. If Q is increased to allow the precision of the numerator to be 55 bits, the precision of the denominator is still 20 bits, so that the precision of the obtained frequency control word F is 35 bits, where the integer portion of the frequency control word F is 5 bits and the decimal portion of the frequency control word F is 30 bits.

It should be noted that both $f_s$ and $f_\Delta$ can be decimal numbers. All values in the above formula (2) are mapped to the hardware circuit and are expressed in binary.

For example, in some other embodiments, the signal processing circuit 11 may be implemented by software or by a combination of software and hardware. As illustrated in FIG. 2B, the signal processing circuit 11 includes an input sub-circuit 210, a frequency detecting sub-circuit 211, and a processing sub-circuit 212. The input sub-circuit 210 is configured to obtain an input signal $S_{in}$ having the input frequency $f_i$ and the frequency regulating coefficient M.m. The frequency detecting sub-circuit 211 is configured to count the input signal $S_{in}$ within a preset period to obtain a count value of the input signal $S_{in}$ and to determine the input frequency $f_i$ based on the count value. The processing sub-circuit 212 is configured to generate the frequency control word F according to the input frequency $f_i$ and the frequency regulating coefficient.

For example, as illustrated in FIG. 2B, the relationship between the frequency control word and the frequency regulating coefficient is expressed as:

$$F=f_\Delta/((M \cdot m) \cdot f_i) \quad (4),$$

where F represents the frequency control word, $f_i$ represents the input frequency, and $f_\Delta$ represents the value of the frequency of the base time unit, for example, $f_\Delta=1/\Delta$, and $\Delta$ represents the base time unit.

For example, different from the embodiment illustrated in FIG. 2A, in the embodiment illustrated in FIG. 2B, the processing sub-circuit 212 is implemented by software, so that the floating point decimal M.m can be directly calculated during calculating the frequency control word. Similarly, the processing sub-circuit 112 may also include a shift register module, a multiplication module, and a division module, and the shift register module, the multiplication module, and the division module are all implemented by software.

It should be noted that, in case of no conflict, for the related functions and structures of the input sub-circuit 210 and the frequency detecting sub-circuit 211 in the embodiment illustrated in FIG. 2B, reference may be made to detailed descriptions of related functions and structures of the input sub-circuit 110 and the frequency detecting sub-circuit 111 in the embodiment illustrated in FIG. 2A, and details are not described herein.

For example, after the frequency control word F is transmitted to the frequency regulating circuit 12, after a delay of two periods, the frequency regulating circuit 12 can output the output signal having the target frequency. As illustrated in FIG. 2A and FIG. 2B, the frequency regulating circuit 12 includes a base time unit generation sub-circuit 120 and a frequency regulating sub-circuit 121. The base time unit generation sub-circuit 120 is configured to generate and output a base time unit. The frequency regulating sub-circuit 121 is configured to generate and output the output signal having the target frequency according to the frequency control word and the base time unit.

For example, the base time unit generation sub-circuit 120 is configured to output the base time unit to the frequency regulating sub-circuit 121 and the processing sub-circuit 112, respectively.

Figure 5A:
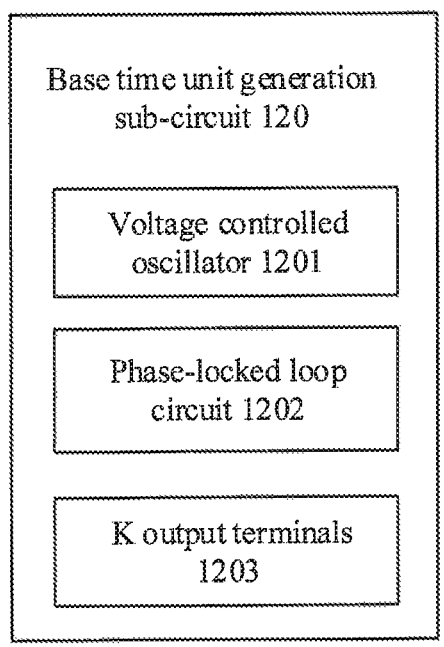
FIG. 5A is a schematic block diagram of a base time unit generation sub-circuit provided by an embodiment of the present disclosure.
Figure 5B:
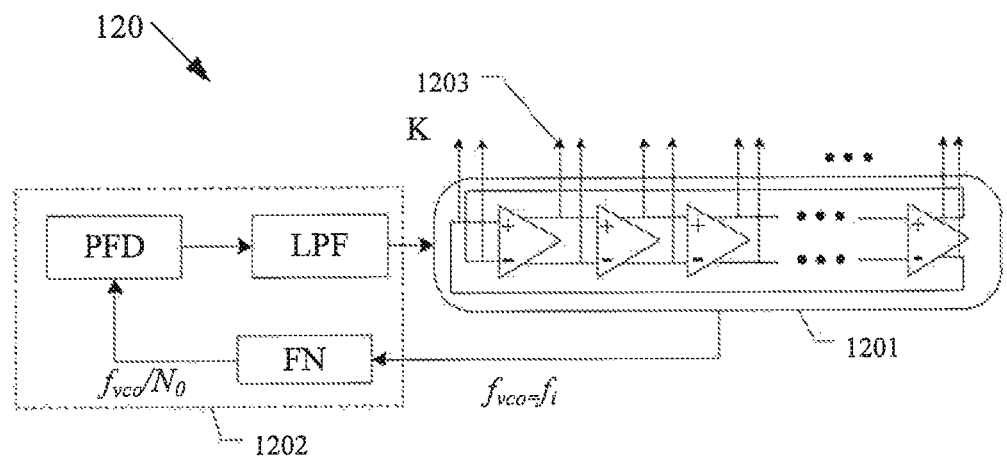
FIG. 5B is a structural schematic diagram of another base time unit generation sub-circuit provided by an embodiment of the present disclosure.

FIG. 5A is a schematic block diagram of a base time unit generation sub-circuit provided by an embodiment of the present disclosure; FIG. 5B is a structural schematic diagram of another base time unit generation sub-circuit provided by an embodiment of the present disclosure; and FIG.

6 is a schematic diagram of K base output signals with phases evenly spaced provided by an embodiment of the present disclosure.

For example, the base time unit generation sub-circuit 120 is configured to generate and output K base output signals with phases evenly spaced and the base time unit. As illustrated in FIG. 5A, the base time unit generation sub-circuit 120 may include a voltage-controlled oscillator (VCO) 1201, a phase-locked loop circuit 1202, and K output terminals 1203. The voltage controlled oscillator 1201 is configured to oscillate at a predetermined oscillation frequency. The phase-locked loop circuit 1202 is configured to lock an output frequency of the voltage-controlled oscillator 1201 at a base output frequency. The K output terminals 1203 are configured to output K base output signals with phases evenly spaced, where K is a positive integer greater than 1. For example, K=16, 32, 128, or other values.

Figure 6:
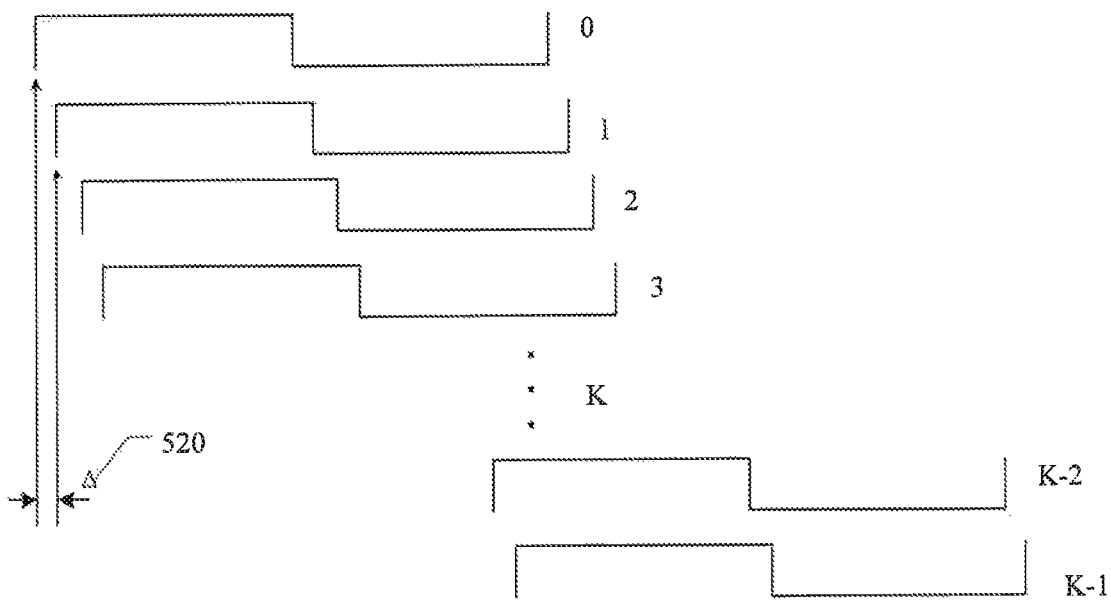
FIG. 6 is a schematic diagram of K base output signals with phases evenly spaced provided by an embodiment of the present disclosure.

For example, the base time unit can be expressed as $\Delta$, and the base output frequency can be expressed as $f_d$. As illustrated in FIG. 6, the base time unit $\Delta$ is a time span between any two adjacent output signals output by the K output terminals 1203. The base time unit $\Delta$ is usually generated by a plurality of voltage-controlled oscillators 1201. The frequency $f_{vco}$ of the signal generated by the voltage-controlled oscillator 1201 can be locked to a known base output frequency $f_d$ by the phase-locked loop circuit 1202, that is, $f_d = f_{vco}$.

For example, the base time unit $\Delta$ can be calculated by using the following formula:

$$\Delta = T_d/K = 1/(K \cdot f_d),$$

where $T_d$ represents the period of the signal generated by the plurality of voltage-controlled oscillators 1201. $f_\Delta$ represents the value of the frequency of the base time unit, that is, $f_\Delta = 1/\Delta = K \cdot f_d$.

For example, as illustrated in FIG. 5B, the phase-locked loop circuit 1202 includes a phase detector PFD, a loop filter LPF, and a frequency divider FN. For example, in the embodiments of the present disclosure, for example, a reference signal having a reference frequency may first be input to the phase detector, then be input to the loop filter, and then be input to the voltage-controlled oscillator, and finally, the signal, having the predetermined oscillation frequency $f_{vco}$, generated by the voltage-controlled oscillator can be divided by the frequency divider to obtain the frequency division frequency $f_{vco}/N_0$ of the frequency division signal, where $N_0$ represents the frequency division coefficient of the frequency divider, and $N_0$ is a real number and is greater than or equal to 1. The frequency division frequency $f_{vco}/N_0$ is fed back to the phase detector, and the phase detector is used to compare the reference frequency of the reference signal with the frequency division frequency $f_{vco}/N_0$. In a case where the reference frequency and the frequency division frequency $f_{vco}/N_0$ have the same frequency and the same phase, the error between the reference frequency and the frequency division frequency $f_{vco}/N_0$ is zero. In this case, the phase-locked loop circuit 1202 is in a locked state.

For example, the loop filter LPF may be a low-pass filter.

It should be noted that the circuit structure illustrated in FIG. 5B is only an exemplary implementation of the base time unit generation sub-circuit 120. The specific structure of the base time unit generation sub-circuit 120 is not limited thereto, the base time unit generation sub-circuit 120 may further include other circuit structures, and the present disclosure does not limit the specific structure of the base time unit generation sub-circuit 120. For example, K and $\Delta$ can be set in advance according to practical requirements, and can be fixed.

Figure 7:
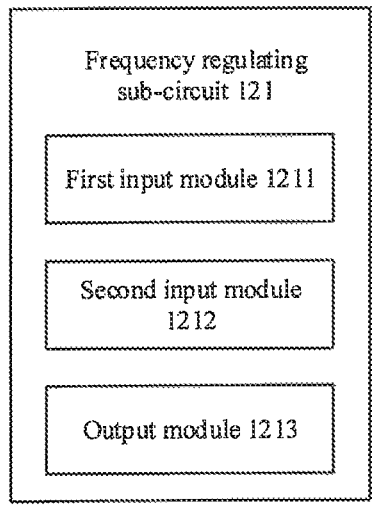
FIG. 7 is a schematic block diagram of a frequency regulating sub-circuit provided by an embodiment of the present disclosure.
Figure 8:
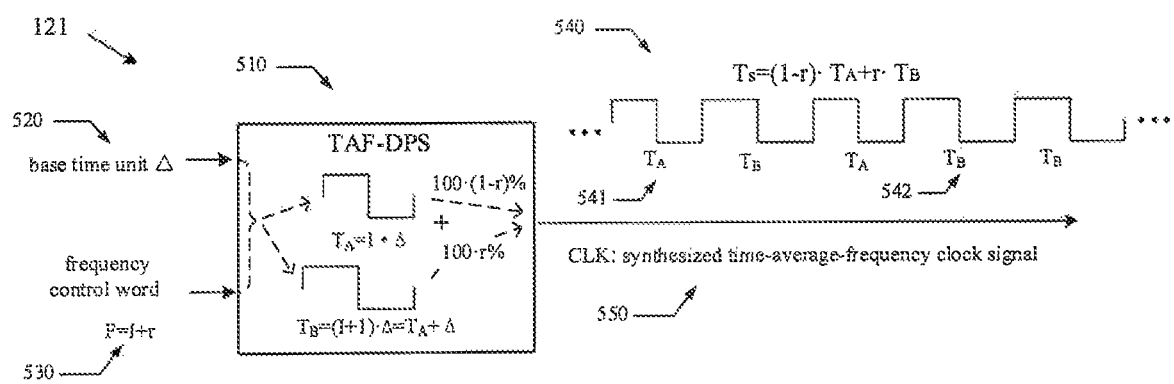
FIG. 8 is a schematic diagram of a working principle of a frequency regulating sub-circuit provided by an embodiment of the present disclosure.

FIG. 7 is a schematic block diagram of a frequency regulating sub-circuit provided by an embodiment of the present disclosure, and FIG. 8 is a schematic diagram of a working principle of a frequency regulating sub-circuit provided by an embodiment of the present disclosure For example, as illustrated in FIG. 7, the frequency regulating sub-circuit 121 includes a first input module 1211, a second input module 1212, and an output module 1213. The first input module 1211 is configured to receive K base output signals with phases evenly spaced and the base time unit from the base time unit generation sub-circuit 120. The second input module 1212 is configured to receive the frequency control word F from the signal processing circuit 11. The output module 1213 is configured to generate and output the output signal having the target frequency that matches the frequency control word and the base time unit.

For example, the frequency regulating sub-circuit 121 may include a time-average-frequency direct period synthesizer (TAF-DPS). The time-average-frequency direct period synthesis (TAF-DPS) technology is an emerging frequency synthesis technology, and can generate pulse signals of any frequency based on the new time-average-frequency concept. That is, the TAF-DPS can implement the fine frequency regulating with small frequency granularity. In addition, because each single pulse is directly constructed, the output frequency of the TAF-DPS can be changed instantaneously, that is, the TAF-DPS has the characteristics of rapidity of frequency switching. Experiments show that the frequency granularity of the TAF-DPS can reach several ppb (parts per billion). More importantly, the switching speed of the frequency of the TAF-DPS is quantifiable. That is, the response time from the time, when the frequency control word is updated, to the time, when the frequency is switched, can be calculated according to the clock period. These characteristics allow the TAF-DPS to be an ideal circuit module for use as a digitally controlled oscillator (DCO). The TAF-DPS can be used as a specific implementation of the frequency regulating sub-circuit 121 in the embodiments of the present disclosure.

For example, the TAF-DPS may be implemented using an application-specific integrated circuit (for example, ASIC), or a programmable logic device (for example, FPGA). Alternatively, the TAF-DPS can be implemented using general analog circuit devices. The present disclosure is not limited in this aspect.

It should be noted that, in the present disclosure, both ppm and ppb can be used to represent the frequency deviation, and ppm and ppb represent values of allowable frequency deviation at a specific center frequency. For example, X ppm means that the maximum frequency error is X parts per million of the center frequency; and similarly, X ppb means that the maximum frequency error is X parts per billion of the center frequency. The frequency is measured in Hertz (Hz).

Hereinafter, a working principle of the frequency regulating sub-circuit 121 based on the TAF-DPS is described with reference to FIG. 8.

For example, as illustrated in FIG. 8, the frequency regulating sub-circuit 121 based on the TAF-DPS 510 has two inputs: a base time unit 520 and a frequency control word 530. The frequency control word 530 is expressed as F, and F=I+r, where I is an integer greater than 1, and r is a fraction.

For example, the TAF-DPS 510 has one output CLK 550. The CLK 550 is a synthesized time-average-frequency clock signal. In the embodiments of the present disclosure, the CLK 550 is the output signal having the target frequency. According to the base time unit 520, the TAF-DPS 510 can generate two types of periods, that is, a first period $T_A = I \cdot \Delta$ and a second period $T_B = (I+1) \cdot \Delta$. The output CLK 550 is a clock pulse string 540, and the clock pulse string 540 includes a first period $T_A$ 541 and a second period $T_B$ 542 in an interleaved manner. The fraction r is used to control the occurrence probability of the second period $T_B$, and therefore, r can also determine the occurrence probability of the first period $T_A$.

For example, as illustrated in FIG. 8, the period $T_{TAF-DPS}$ of the output signal CLK 550 can be expressed by the following formula:

$$\begin{aligned} T_o &= (1-r) \cdot T_A + r \cdot T_B \\ &= T_A + r \cdot (T_B - T_A) \\ &= T_A + r \cdot \Delta \\ &= I \cdot \Delta + r \cdot \Delta \\ &= (I+r) \cdot \Delta \end{aligned}$$

Therefore, in a case where the frequency control word 530 is F=I+r, the following formula can be obtained:

$$T_o = F \cdot \Delta \quad (5)$$

From the above formula (4), it can be seen that the period $T_o$ of the output signal CLK output by the TAF-DPS 510 is linearly proportional to the frequency control word 530. Where the frequency control word 530 changes, the period $T_o$ of the output signal output by the TAF-DPS 510 may also change in the same manner.

For example, in the embodiment illustrated in FIG. 2A, based on the above formula (2) and formula (5), the target frequency $f_o$ can be expressed as:

$$f_o = 1/T_o = 1/(F \cdot \Delta) = f_\Delta/F = (N \cdot f_i)/2^m,$$

where $\Delta$ represents the base time unit, and $f_\Delta$ represents the frequency of the base time unit. For example, because $N=(M.m) \cdot 2^m$, $f_o = (M.m) \cdot f_i$.

For example, in the embodiment illustrated in FIG. 2B, based on the above formula (4) and formula (5), the target frequency $f_o$ can be expressed as:

$$f_o = 1/T_o = 1/(F \cdot \Delta) = f_\Delta/F = (M.m) \cdot f_i$$

In summary, the ratio between the input frequency $f_i$ and the target frequency $f_o$ is the frequency regulating coefficient M.m, and the frequency regulating coefficient M.m can be any value, so that the frequency regulator can obtain the output signal having an arbitrary target frequency $f_o$ based on the input frequency.

For example, in a specific embodiment, in a case where the value of the input frequency $f_i$ is 19.4399919107759 MHz and the frequency regulating coefficient M.m is set to 4.78. Based on the input frequency and the frequency regulating coefficient, a theoretical target frequency of 92.923161333508802 MHz can be obtained, and the actual target frequency $f_o$ of the output signal actually output by the frequency regulator 10 is 92.9231587853850 MHz. The error value is about 27.4 ppb, and the precision can already meet the requirements of most electronic systems. It should be noted that, in this embodiment, the instrument for measuring the target frequency may be a commercially available universal frequency counter/timer with a model of Keysight53230A.

Figure 9:
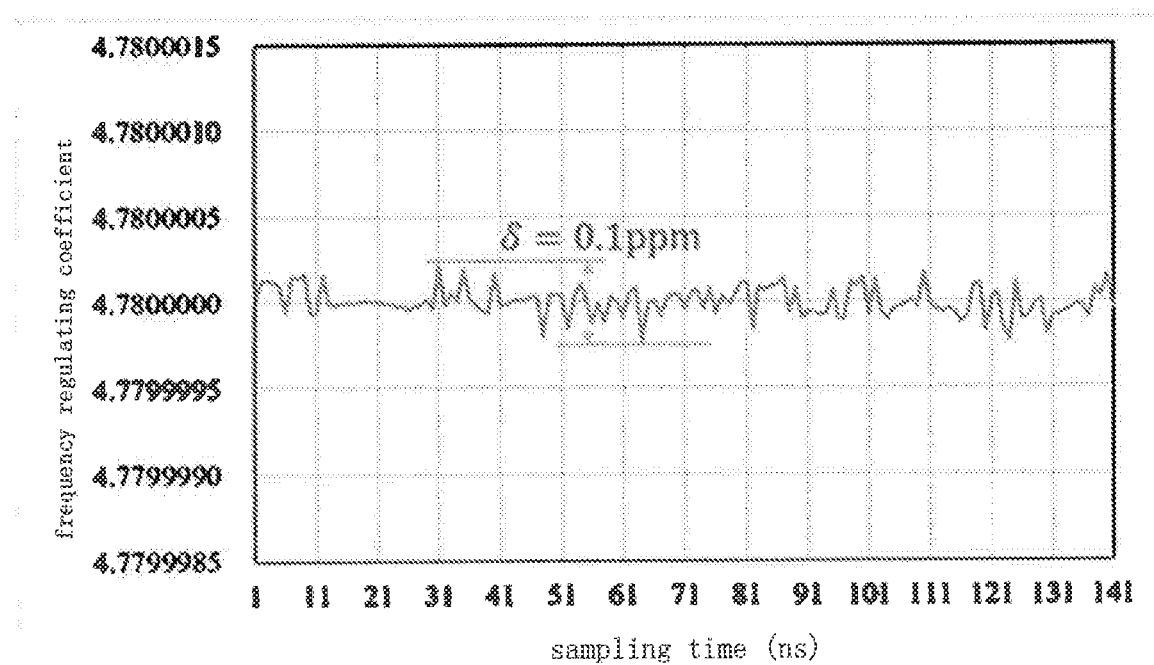
FIG. 9 is a schematic diagram of a stability testing result of a frequency regulator provided by an embodiment of the present disclosure.

FIG. 9 is a schematic diagram of a stability testing result of a frequency regulator provided by an embodiment of the present disclosure. As illustrated in FIG. 9, in the frequency regulator 10, the precision of the frequency regulating coefficient fluctuates up and down within a range of 0.1 ppm. It should be noted that, in this embodiment, a ppm-level frequency source is used (for example, a commercially available frequency source with a model of SiT9102 MEMS), and therefore, corresponding dynamic jitter is introduced. However, the stability testing result still show that the frequency regulator 10 has good stability. Therefore, the frequency regulator 10 provided by the embodiments of the present disclosure still has the characteristics of high precision and high stability on the premise of implementing an arbitrary frequency regulating coefficient.

Figure 10A:
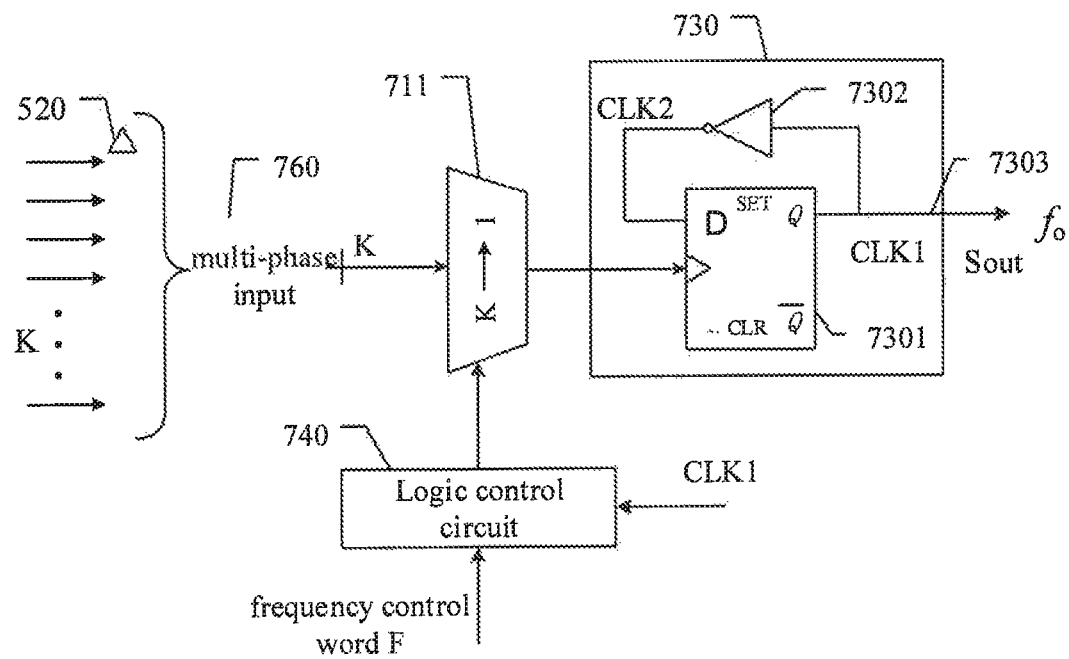
FIG. 10A is a structural schematic diagram of a frequency regulating sub-circuit provided by an embodiment of the present disclosure.
Figure 10B:
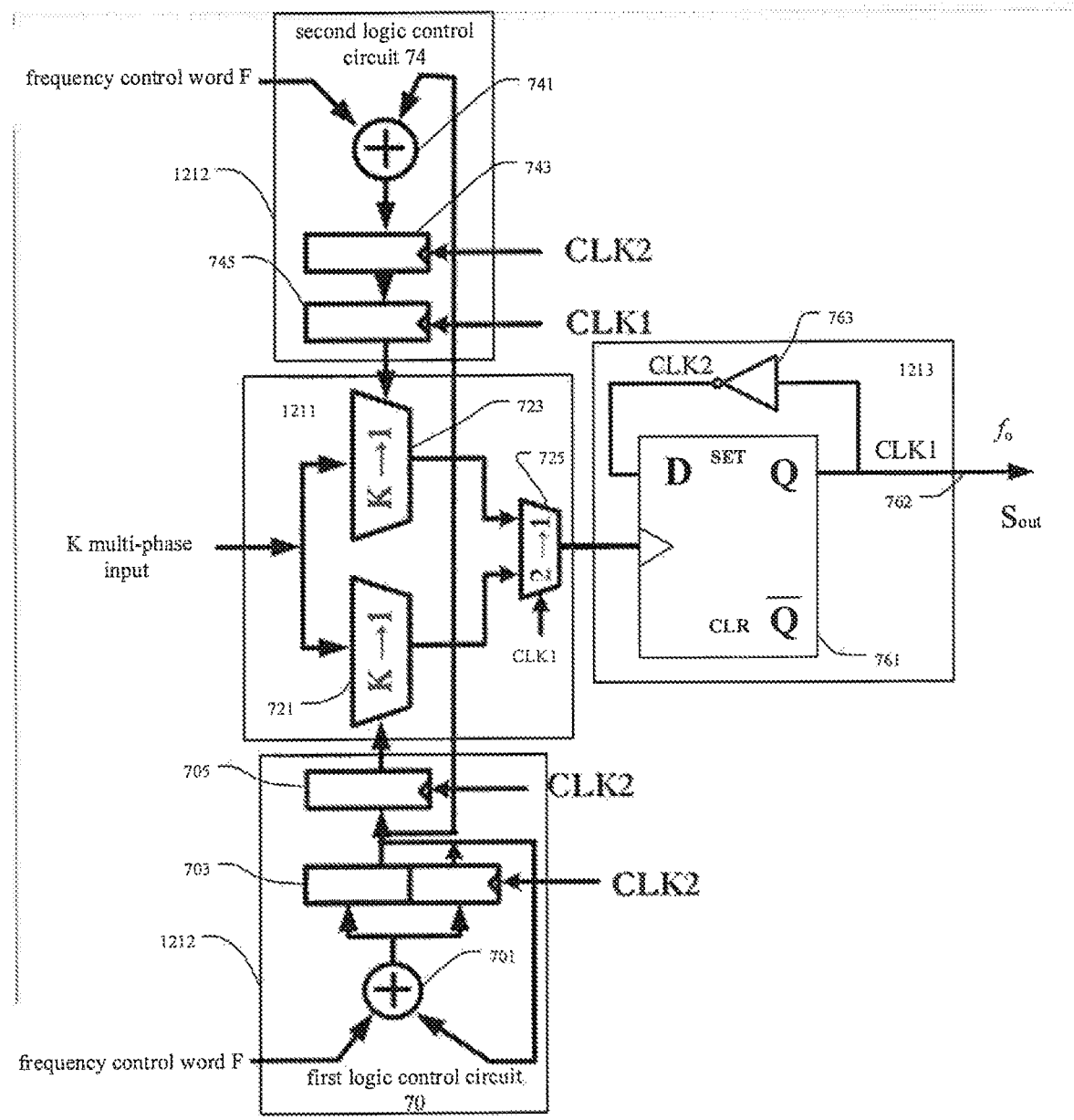
FIG. 10B is a structural schematic diagram of another frequency regulating sub-circuit provided by an embodiment of the present disclosure.

FIG. 10A is a structural schematic diagram of a frequency regulating sub-circuit provided by an embodiment of the present disclosure, and FIG. 10B is a structural schematic diagram of another frequency regulating sub-circuit provided by an embodiment of the present disclosure.

Hereinafter, a circuit structure of the TAF-DPS is described with reference to FIG. 10A and FIG. 10B.

For example, as illustrated in FIG. 10A, in one embodiment, the first input module 1211 includes a K→1 multiplexer 711. The K→1 multiplexer 711 has a plurality of input terminals for receiving K base output signals with phases evenly spaced, a control input terminal, and an output terminal.

For example, the output module 1213 includes a trigger circuit 730. The trigger circuit 730 is used to generate a pulse string. The pulse string includes, for example, a pulse signal of a first period $T_A$ and a pulse signal of a second period $T_B$ in an interleaved manner. The trigger circuit 730 includes a D flip-flop 7301, an inverter 7302, and an output terminal 7303. The D flip-flop 7301 includes a data input terminal, a clock input terminal for receiving an output of the output terminal of the K→1 multiplexer 711, and an output terminal for outputting a first clock signal CLK1. The inverter 7302 includes an inverter input terminal for receiving the first clock signal CLK1 and an inverter output terminal for outputting a second clock signal CLK2. The output terminal 7303 of the trigger circuit 730 is used to output the first clock signal CLK1 as the output signal $S_{out}$ having the target frequency $f_o$.

For example, the first clock signal CLK1 includes a pulse string. The second clock signal CLK2 is connected to the data input terminal of the D flip-flop 7301.

For example, the second input module 1212 includes a logic control circuit 740. The logic control circuit 740 includes an input terminal for receiving the frequency control word F output by the signal processing circuit 11, a clock input terminal for receiving the first clock signal CLK1, and an output terminal connected to the control input terminal of the K→1 multiplexer of the first input module 1211.

For example, as illustrated in FIG. 10B, in another embodiment, the first input module 1211 includes a first K→1 multiplexer 721, a second K→1 multiplexer 723, and a 2→1 multiplexer 725. Each of the first K→1 multiplexer 721 and the second K→1 multiplexer 723 include a plurality of input terminals for receiving K signals with phases evenly spaced, a control input terminal, and an output terminal. The 2→1 multiplexer 725 includes a control input terminal, an output terminal, a first input terminal for receiving the output of the first K→1 multiplexer 721, and a second input terminal for receiving the output of the second K→1 multiplexer 723.

For example, as illustrated in FIG. 10B, the output module 1213 includes a trigger circuit. The trigger circuit is used to generate a pulse string. The trigger circuit includes a D flip-flop 761, an inverter 763, and an output terminal 762. The D flip-flop 761 includes a data input terminal, a clock input terminal for receiving an output of the output terminal of the 2→1 multiplexer 725, and an output terminal for outputting a first clock signal CLK1. The inverter 763 includes an input terminal for receiving the first clock signal CLK1, and an output terminal for outputting a second clock signal CLK2. The output terminal 762 of the trigger circuit is used to output the first clock signal CLK1 as the output signal $S_{out}$ having the target frequency $f_o$.

For example, the first clock signal CLK1 is connected to the control input terminal of the 2→1 multiplexer 725, and the second clock signal CLK2 is connected to the data input terminal of the D flip-flop 761.

For example, as illustrated in FIG. 10B, the second input module 1212 includes a first logic control circuit 70 and a second logic control circuit 74. The first logic control circuit 70 includes a first adder 701, a first register 703, and a second register 705. The second logic control circuit 74 includes a second adder 741, a third register 743, and a fourth register 745.

The first adder 701 adds the frequency control word (F) and the most significant bits (for example, 5 bits) stored in the first register 703, and then stores the addition result in the first register 703 at a rising edge of the second clock signal CLK2 alternatively, the first adder 701 adds the frequency control word (F) and all the information stored in the first register 703, and then stores the addition result in the first register 703 at the rising edge of the second clock signal CLK2. At a rising edge of a next second clock signal CLK2, the most significant bits stored in the first register 703 will be stored in the second register 705 and serves as the selection signal of the first K→1 multiplexer 721 for selecting one signal from the K multi-phase input signals as the first output signal of the first K→1 multiplexer 721.

The second adder 741 adds the frequency control word (F) and the most significant bits stored in the first register 703, and then stores the addition result in the third register 743 at the rising edge of the second clock signal CLK2. At the rising edge of the next first clock signal CLK1, the information stored in the third register 743 will be stored in the fourth register 745 and used as the selection signal of the second K→1 multiplexer 723 for selecting one signal from the K multi-phase input signals as the second output signal of the second K→1 multiplexer 723.

At the rising edge of the first clock signal CLK1, the 2→1 multiplexer 725 selects one of the first output signal from the first K→1 multiplexer 721 and the second output signal from the second K→1 multiplexer 723 as the output signal of the 2→1 multiplexer 725, and the output signal of the 2→1 multiplexer 725 serves as the input clock signal of the D flip-flop 761.

For example, the period ($T_o$) of the output signal $S_{out}$ output from the TAF-DPS illustrated in FIG. 10A and FIG. 10B can be calculated according to the above formula (4). For example, the frequency control word is set in the form of F=I+r, where I is an integer in the range of [2, 2K], and r is a decimal in the range of [0, 1).

Figure 11:
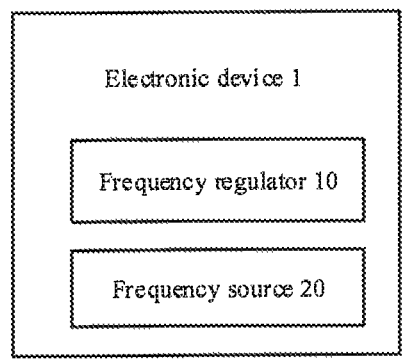
FIG. 11 is a schematic block diagram of an electronic device provided by an embodiment of the present disclosure.

At least an embodiment of the present disclosure further provides an electronic device. FIG. 11 is a schematic block diagram of an electronic device provided by an embodiment of the present disclosure.

For example, as illustrated in FIG. 11, the electronic device 1 provided by the embodiments of the present disclosure may include a frequency source 20 and the frequency regulator 10 according to any one of the above embodiments.

For example, the frequency source 20 is configured to provide an input signal having an input frequency and to transmit the input signal into the frequency regulator 10.

For example, the frequency source 20 may include a self-excited oscillation source and a synthetic frequency source. The self-excited oscillation source includes a crystal oscillator, a cavity oscillator, a voltage-controlled oscillator, etc. The synthetic frequency source includes a direct analog frequency source, a direct digital frequency source, an indirect analog frequency source, and an indirect digital frequency source.

It should be noted that, detailed descriptions of the frequency regulator 10 can be with reference to the related descriptions in the above embodiments of the frequency regulator, and details are not described herein.

Figure 12:
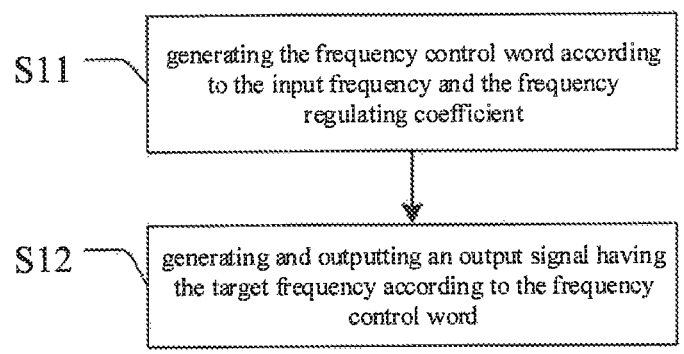
FIG. 12 is a schematic flowchart of a frequency regulating method provided by an embodiment of the present disclosure.

At least an embodiment of the present disclosure further provides a frequency regulating method. FIG. 12 is a schematic flowchart of a frequency regulating method provided by an embodiment of the present disclosure. The frequency regulating method provided by the embodiments of the present disclosure can be implemented based on the frequency regulator provided by any one of the embodiments of the present disclosure.

For example, as illustrated in FIG. 12, the frequency regulating method provided by the embodiments of the present disclosure may include the following operations.

A step S11: generating the frequency control word according to the input frequency and the frequency regulating coefficient.

A step S12: generating and outputting an output signal having the target frequency according to the frequency control word.

The frequency regulating method provided by the embodiments of the present disclosure can provide a high-precision and high-stability output signal on the premise of implementing an arbitrary frequency regulating coefficient. The frequency regulating method has the characteristics such as the simple and high-efficiency process of obtaining the output signal, easy-to-control, high-precision, programmability, etc.

For example, in the embodiment illustrated in FIG. 2A, the step S11 may include: obtaining an input signal having the input frequency and the frequency regulating coefficient; counting the input signal based on a preset period to obtain a count value of the input signal; determining the input frequency based on the count value; performing integer processing on the frequency regulating coefficient to obtain an integer frequency regulating coefficient; and generating the frequency control word according to the input frequency and the integer frequency regulating coefficient.

For example, in the embodiment illustrated in FIG. 2B, the step S11 may include: obtaining an input signal having the input frequency and the frequency regulating coefficient; counting the input signal based on a preset period to obtain a count value of the input signal; determining the input frequency based on the count value; and generating the frequency control word according to the input frequency and the frequency regulating coefficient.

For example, in the step S12, the output signal having the target frequency may be generated by the TAF-DPS.

It should be noted that for the description of the frequency regulating method, reference can be made to the above description of the frequency regulator. The frequency regulating method illustrated in FIG. 12 may be implemented by the frequency regulator provided by any one of the embodiments of the present disclosure. For example, the step S11 may be implemented by a signal processing circuit in the frequency regulator provided by any one of the embodiments of the present disclosure, the step S12 may be implemented by a frequency regulating circuit in the frequency regulator provided by any one of the embodiments of the present disclosure, and similar operations or steps are not described herein.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A frequency regulator, comprising:
    a signal processing circuit, configured to generate a frequency control word according to a frequency regulating coefficient and an input frequency;
    a frequency regulating circuit, configured to receive the frequency control word and to generate and output an output signal having a target frequency according to the frequency control word,
    wherein the frequency regulating coefficient is an arbitrary positive real number and is expressed as M.m, M is an integer portion of the frequency regulating coefficient and is a natural number, and m is a decimal portion of the frequency regulating coefficient;
    the target frequency is calculated by a following formula:

$$f_o=(M.m)\cdot f_i,$$

wherein $f_i$ represents the input frequency, and $f_o$ represents the target frequency.

2. The frequency regulator according to claim 1, wherein the signal processing circuit comprises:
    an input sub-circuit, configured to obtain an input signal having the input frequency and the frequency regulating coefficient;
    a frequency detecting sub-circuit, configured to count the input signal within a preset period to obtain a count value of the input signal, and to determine the input frequency based on the count value; and
    a processing sub-circuit, configured to generate the frequency control word according to the input frequency and the frequency regulating coefficient.

3. The frequency regulator according to claim 2, wherein a relationship between the frequency control word and the frequency regulating coefficient is expressed as:

$$F=f_\Delta/((M.m)\cdot f_i),$$

wherein F represents the frequency control word, $f_i$ represents the input frequency, and $f_\Delta$ represents a value of a frequency of a base time unit.

4. The frequency regulator according to claim 2, wherein the processing sub-circuit is further configured to perform an integer processing on the frequency regulating coefficient to obtain an integer frequency regulating coefficient, and to generate the frequency control word according to the input frequency and the integer frequency regulating coefficient.

5. The frequency regulator according to claim 4, wherein a relationship between the frequency control word and the integer frequency regulating coefficient is expressed as:

$$F=(f_\Delta \cdot 2^m)/(N\cdot f_i),$$

wherein F represents the frequency control word, $N=(M.m)\cdot 2^m$, N represents the integer frequency regulating coefficient and is a positive integer greater than 1, $f_i$ represents the input frequency, and $f_\Delta$ represents a value of a frequency of a base time unit.

6. The frequency regulator according to claim 4, wherein a relationship between the frequency control word and the integer frequency regulating coefficient is expressed as:

$$F=(f_\Delta \cdot 2^m \cdot Q)/(N\cdot f_i),$$

wherein F represents the frequency control word, $N=(M.m)\cdot 2^m$, N represents the integer frequency regulating coefficient and is a positive integer greater than 1, $f_i$ represents the input frequency, $f_\Delta$ represents a value of a frequency of a base time unit, and Q is a positive integer.

7. The frequency regulator according to claim 2, wherein the input frequency is expressed as:

$$f_i=f_{cnt}/T,$$

wherein $f_i$ represents the input frequency, $f_{cnt}$ represents the count value, T represents the preset period, and a unit of the preset period is a second.

8. The frequency regulator according to claim 2, wherein the frequency detecting sub-circuit comprises a counting module, a period generation module, and a calculation module,
    the period generation module is configured to generate the preset period under control of a clock signal;
    the counting module is configured to count the input signal within the preset period to obtain the count value of the input signal; and
    the calculation module is configured to determine the input frequency based on the count value, and to output the input frequency to the processing sub-circuit.

9. The frequency regulator according to claim 3, wherein the processing sub-circuit comprises a shift register module, a multiplication module, and a division module,
    the shift register module is configured to receive and process the frequency of the base time unit;
    the multiplication module is configured to receive the input frequency and the frequency regulating coefficient, and to perform multiplication processing on the input frequency and the frequency regulating coefficient; and
    the division module is configured to receive an output of the shift register module and an output of the multiplication module, and to divide the output of the shift register module by the output of the multiplication module to obtain the frequency control word.

10. The frequency regulator according to claim 1, wherein the frequency regulating circuit comprises:
    a base time unit generation sub-circuit, configured to generate and output a base time unit; and
    a frequency regulating sub-circuit, configured to generate and output the output signal having the target frequency according to the frequency control word and the base time unit.

11. The frequency regulator according to claim 10, wherein the base time unit generation sub-circuit comprises:
    a voltage-controlled oscillator, configured to oscillate at a predetermined oscillation frequency;

a phase-locked loop circuit, configured to lock an output frequency of the voltage-controlled oscillator at a base output frequency; and K output terminals, configured to output K output signals with phases evenly spaced, wherein K is a positive integer greater than 1, wherein the base output frequency is expressed as $f_d$, the base time unit is a time span between any two adjacent output signals output by the K output terminals, the base time unit is expressed as $\Delta$, and $\Delta=1/(K \cdot f_d)$.

12. The frequency regulator according to claim 10, wherein the frequency regulating sub-circuit is a time-average-frequency direct period synthesizer.

13. An electronic device, comprising:
a frequency source, configured to provide an input signal having an input frequency; and
a frequency regulator,
wherein the frequency regulator comprises: a signal processing circuit, configured to generate a frequency control word according to a frequency regulating coefficient and the input frequency; and a frequency regulating circuit, configured to receive the frequency control word and to generate and output an output signal having a target frequency according to the frequency control word,
the frequency regulating coefficient is an arbitrary positive real number and is expressed as M.m, M is an integer portion of the frequency regulating coefficient and is a natural number, and m is a decimal portion of the frequency regulating coefficient;
the target frequency is calculated by a following formula:

$$f_o=(M.m) \cdot f_i,$$

wherein $f_i$ represents the input frequency, and $f_o$ represents the target frequency.

14. A frequency regulating method, applicable to a frequency regulator,
wherein the frequency regulator comprises: a signal processing circuit, configured to generate a frequency control word according to a frequency regulating coefficient and an input frequency; and a frequency regulating circuit, configured to receive the frequency control word and to generate and output an output signal having a target frequency according to the frequency control word,
the frequency regulating coefficient is an arbitrary positive real number and is expressed as M.m, M is an integer portion of the frequency regulating coefficient and is a natural number, and m is a decimal portion of the frequency regulating coefficient,
the target frequency is calculated by a following formula:

$$f_o=(M.m) \cdot f_i,$$

wherein $f_i$ represents the input frequency, and $f_o$ represents the target frequency,
the frequency regulating method comprises:
generating the frequency control word according to the input frequency and the frequency regulating coefficient; and
generating and outputting the output signal having the target frequency according to the frequency control word.

15. The frequency regulating method according to claim 14, wherein generating the frequency control word according to the input frequency and the frequency regulating coefficient comprises:

obtaining an input signal having the input frequency and the frequency regulating coefficient;
counting the input signal based on a preset period to obtain a count value of the input signal;
determining the input frequency based on the count value; and
generating the frequency control word according to the input frequency and the frequency regulating coefficient.

16. The frequency regulating method according to claim 14, wherein generating the frequency control word according to the input frequency and the frequency regulating coefficient comprises:
obtaining an input signal having the input frequency and the frequency regulating coefficient;
counting the input signal based on a preset period to obtain a count value of the input signal;
determining the input frequency based on the count value;
performing integer processing on the frequency regulating coefficient to obtain an integer frequency regulating coefficient; and
generating the frequency control word according to the input frequency and the integer frequency regulating coefficient.

17. The frequency regulator according to claim 3, wherein the input frequency is expressed as:

$$f_i=f_{cnt}/T,$$

wherein $f_i$ represents the input frequency, $f_{cnt}$ represents the count value, T represents the preset period, and a unit of the preset period is a second.

18. The frequency regulator according to claim 3, wherein the frequency detecting sub-circuit comprises a counting module, a period generation module, and a calculation module,
the period generation module is configured to generate the preset period under control of a clock signal;
the counting module is configured to count the input signal within the preset period to obtain the count value of the input signal; and
the calculation module is configured to determine the input frequency based on the count value, and to output the input frequency to the processing sub-circuit.

19. The frequency regulator according to claim 5, wherein the processing sub-circuit comprises a shift register module, a multiplication module, and a division module,
the shift register module is configured to receive and process the frequency of the base time unit;
the multiplication module is configured to receive the input frequency and the frequency regulating coefficient, and to perform multiplication processing on the input frequency and the frequency regulating coefficient; and
the division module is configured to receive an output of the shift register module and an output of the multiplication module, and to divide the output of the shift register module by the output of the multiplication module to obtain the frequency control word.

20. The frequency regulator according to claim 2, wherein the frequency regulating circuit comprises:
a base time unit generation sub-circuit, configured to generate and output a base time unit; and
a frequency regulating sub-circuit, configured to generate and output the output signal having the target frequency according to the frequency control word and the base time unit.

* * * * *